(12) United States Patent
Hirler et al.

(10) Patent No.: US 6,498,382 B2
(45) Date of Patent: Dec. 24, 2002

(54) SEMICONDUCTOR CONFIGURATION

(75) Inventors: Franz Hirler, Isen (DE); Wolfgang Werner, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/817,579

(22) Filed: Mar. 26, 2001

(65) Prior Publication Data

US 2001/0035561 A1 Nov. 1, 2001

(30) Foreign Application Priority Data

Mar. 24, 2000 (DE) ........................................ 100 14 660

(51) Int. Cl.⁷ .............................................. H01L 29/00
(52) U.S. Cl. ...................... 257/510; 257/544; 257/330; 257/341; 438/221; 438/296; 438/353
(58) Field of Search ................................. 257/510, 538, 257/544, 330, 329, 331, 139, 147, 140, 341, 378; 438/221, 296, 353

(56) References Cited

U.S. PATENT DOCUMENTS

| 5,488,236 A | * | 1/1996 | Baliga et al. ............... 257/132 |
| 5,623,152 A | * | 4/1997 | Majumdar et al. ........... 257/330 |
| 5,786,613 A | * | 7/1998 | Kalnitsky .................... 257/355 |
| 5,917,216 A | * | 6/1999 | Floyd et al. ................. 257/330 |
| 5,981,999 A | * | 11/1999 | Liu et al. ..................... 257/339 |
| 5,986,304 A | * | 11/1999 | Hshieh et al. ............... 257/330 |
| 5,998,837 A | * | 12/1999 | Williams .................... 257/341 |
| 6,246,092 B1 | * | 6/2001 | Fujikira et al. ............. 257/341 |

FOREIGN PATENT DOCUMENTS

JP  11 017 166 A  1/1999

* cited by examiner

*Primary Examiner*—Hoai Ho
*Assistant Examiner*—Andy Huynh
(74) *Attorney, Agent, or Firm*—Laurence A. Greenberg; Werner H. Stemer; Ralph E. Locher

(57) ABSTRACT

The invention relates to a semiconductor configuration in which electrodes are insulated by a gas-filled or evacuated cavity. The semiconductor configuration includes at least two rigid electrodes; body regions; an active zone; a drift path; and an insulating device electrically isolating the at least two electrodes from each another. At least one of the at least two electrodes is a trench electrode electrically connected to the active zone. The insulating device includes a structure selected from the group consisting of at least one insulating or holding layer and a pn junction. The insulating device is further formed with at least one cavity. The trench electrode is isolated from the drift path by the cavity and surrounded by the cavity.

14 Claims, 2 Drawing Sheets

SEMICONDUCTOR CONFIGURATION

BACKGROUND OF THE INVENTION

Field of the Invention

The present invention relates to a semiconductor configuration having at least two rigid electrodes, which are electrically isolated from one another by an insulating device including at least one insulating or holding layer and/or a pn junction, and in particular to a semiconductor configuration having a trench electrode introduced between body regions for the purpose of reducing the on resistance of the semiconductor configuration, the trench electrode being electrically connected to an active zone of the semiconductor configuration and being isolated from a drift path of the semiconductor configuration by the insulating device.

"Rigid" electrodes are to be understood to mean electrodes as are usually used in semiconductor configurations and are composed, for example, of metal, polycrystalline silicon, etc. By contrast, membrane electrodes as are used in pressure sensors or ink-jet printers are not rigid electrodes.

Semiconductors are to be understood to mean all customary semiconducting materials, such as silicon, silicon carbide, $A_{III}B_V$, etc.

As is known, there are publications on high-voltage DMOS transistors for voltages above 200 V, in which the on resistance is reduced by a factor of 2 . . . 3 by introducing a trench electrode between body regions. The trench electrode between the body regions of the cell array of DMOS (Double Diffused Metal Oxide Semiconductor) transistors decisively reduces the epitaxial proportion—predominant in the case of large breakdown voltages above 200 V—of the resistance of the DMOS transistors forming a DMOS cell, with the result that the specified reduction of the on resistance can be achieved.

In such a DMOS cell, the trench system formed by the trench electrodes between the body regions is constructed in such a way that the trench electrodes are connected to gate or, if appropriate, also source of the DMOS transistors and are isolated from the drift path of these DMOS transistors by an insulating device. The drift path usually includes an n-conducting epitaxial silicon layer into which trenches are introduced between the body regions of the transistors. These trenches are filled with electrodes made, for example, of $n^+$-conducting polycrystalline silicon in their core and an insulating device which surrounds this polycrystalline silicon and is made, for example, of silicon dioxide. For transistors designed for about 600 V, layer thicknesses of the order of magnitude of 5 to 10 μm are necessary for this silicon dioxide, which can lead to crystal defects on account of the different thermal expansion coefficients of silicon and silicon dioxide.

SUMMARY OF THE INVENTION

It is accordingly an object of the invention to provide a semiconductor configuration which overcomes the above-mentioned disadvantageous of the prior art semiconductor configurations of this general type. In particular, it is an object of the invention to provide an improved semiconductor configuration of the type mentioned in the introduction such that, the doping of the drift path can be increased further while the dielectric strength remains the same and problems caused by different thermal expansion coefficients are prevented. The intention is that this semiconductor configuration can be fabricated with little outlay.

With the foregoing and other objects in view there is provided, in accordance with the invention a semiconductor configuration that includes: at least two rigid electrodes; and an insulating device electrically isolating the at least two electrodes from each another. The insulating device is formed with at least one cavity and the insulating device includes a structure selected from the group consisting of at least one insulating or holding layer and a pn junction.

In accordance with an added feature of the invention, there is provided: body regions; an active zone; and a drift path. At least one of the at least two electrodes is a trench electrode introduced between the body regions for reducing on resistance. The trench electrode is electrically connected to the active zone and isolated from the drift path by the cavity.

In accordance with an additional feature of the invention, there is provided, an edge termination that includes the trench electrode. The trench electrode has a bearing area. A pn junction is provided for insulating the trench electrode and the bearing area of the trench electrode.

In accordance with another feature of the invention, there is provided, a highly doped region of a first conduction type that shields the trench electrode. The drift path is of the first conduction type.

In accordance with a further feature of the invention, there is provided: an edge termination including the trench electrode; and a highly doped region of a first conduction type shielding the trench electrode. The drift path is of the first conduction type.

In accordance with a further added feature of the invention, there is provided, an edge termination including an edge and a plurality of trench electrodes having distances therebetween. The distances between the plurality of the trench electrodes become greater toward the edge.

In accordance with a further additional feature of the invention, there is provided, a plurality of trench electrodes disposed between adjacent ones of the body regions.

In accordance with another further feature of the invention, there is provided, a plurality of trench electrodes routed through the body regions.

In accordance with yet an added feature of the invention, there is provided, an edge termination including a plurality of trench electrodes insulated by a cavity.

In accordance with yet an additional feature of the invention, the cavity is filled with gas.

In accordance with yet another feature of the invention, the gas is hydrogen.

In accordance with yet a further feature of the invention, the cavity is evacuated.

In accordance with yet another added feature of the invention, at least one of the at least two electrodes is made of polycrystalline silicon.

In accordance with a concomitant feature of the invention, the cavity defines walls that are at least partially covered with a thin silicon dioxide layer.

The present invention thus takes a completely different path from the previous prior art: instead of silicon dioxide and/or silicon nitride as customary insulating device, a gas-filled or evacuated cavity which surrounds the trench electrode is used. Such a cavity has very decisive and significant advantages over customary insulators:

(a) The relative permittivity of a cavity ($\epsilon \approx 1$) is significantly lower than the relative permittivity of, for example, silicon dioxide ($\epsilon \approx 4$). As a result, the ratio of the permittivity of silicon (∈=12) to the permittivity of the cavity is a factor of 4 greater than the ratio of the permittivity of silicon to the permittivity of silicon dioxide. On account of this significantly larger ratio of the permittivities of silicon and the cavity, an ideally virtually constant field strength can be built up in the drift path in the semiconductor configuration, such as, for example, a high-voltage DMOS transistor for voltages above 200 V. On account of this constant field strength, the length of the drift path can be reduced. The reduced length of the drift path and the charge compensation effect obtained by the trench electrode lead to a considerable reduction of the on resistance Ron.

(b) The problem of crystal defects caused by different thermal expansion coefficients of silicon and silicon dioxide and/or silicon nitride is completely avoided.

(c) The customary possibilities of surface micromachining enable cavity trench structures with a trench electrode insulated by a cavity to be realized relatively simply and without a high outlay.

As will be explained in more detail further below, a cavity advantageously exploits Paschen's law: according to this, the breakdown voltage increases again as the dimensions of the cavity decrease, since, with these spacings, impact ionization can no longer occur. Thus, breakdown voltages of about 6 kV are achieved for dimensions of the order of magnitude of 1 μm.

The mechanical strength of the trench electrode in a cavity is entirely unproblematic: a bar of polycrystalline silicon having a length of, for example, 30 μm and a cross-sectional area of 1×1 μm$^2$ has a resonant frequency of about 1.5 MHz. This frequency is distinctly above the frequency of switched-mode power supplies, which can be up to 100 kHz. Bending of such a bar by 1 μm requires a bending force of about 1.5 μN at the end of the bar. The tensile stress occurring in the process amounts, however, merely to about 10% of the breaking stress of the bar. The resulting electrical attractive force between the trench electrode and the semiconductor region, in particular an n-conducting epitaxial layer, surrounding the trench electrode via the cavity is practically equal to zero on account of the symmetrical construction with which the semiconductor region surrounds the trench electrode over the entire periphery thereof. A comparable force of 1.3 μN would occur only in the event of voltage differences of about 100 V between one side and the other side of the trench electrode, the voltage differences being caused for example by asymmetries in the geometrical construction. However, such an asymmetrical construction is not manifested in practice.

In order to saturate interface states, the cavity may be completely or partially covered with a thin silicon dioxide layer on its walls.

Other features which are considered as characteristic for the invention are set forth in the appended claims.

Although the invention is illustrated and described herein as embodied in a semiconductor configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
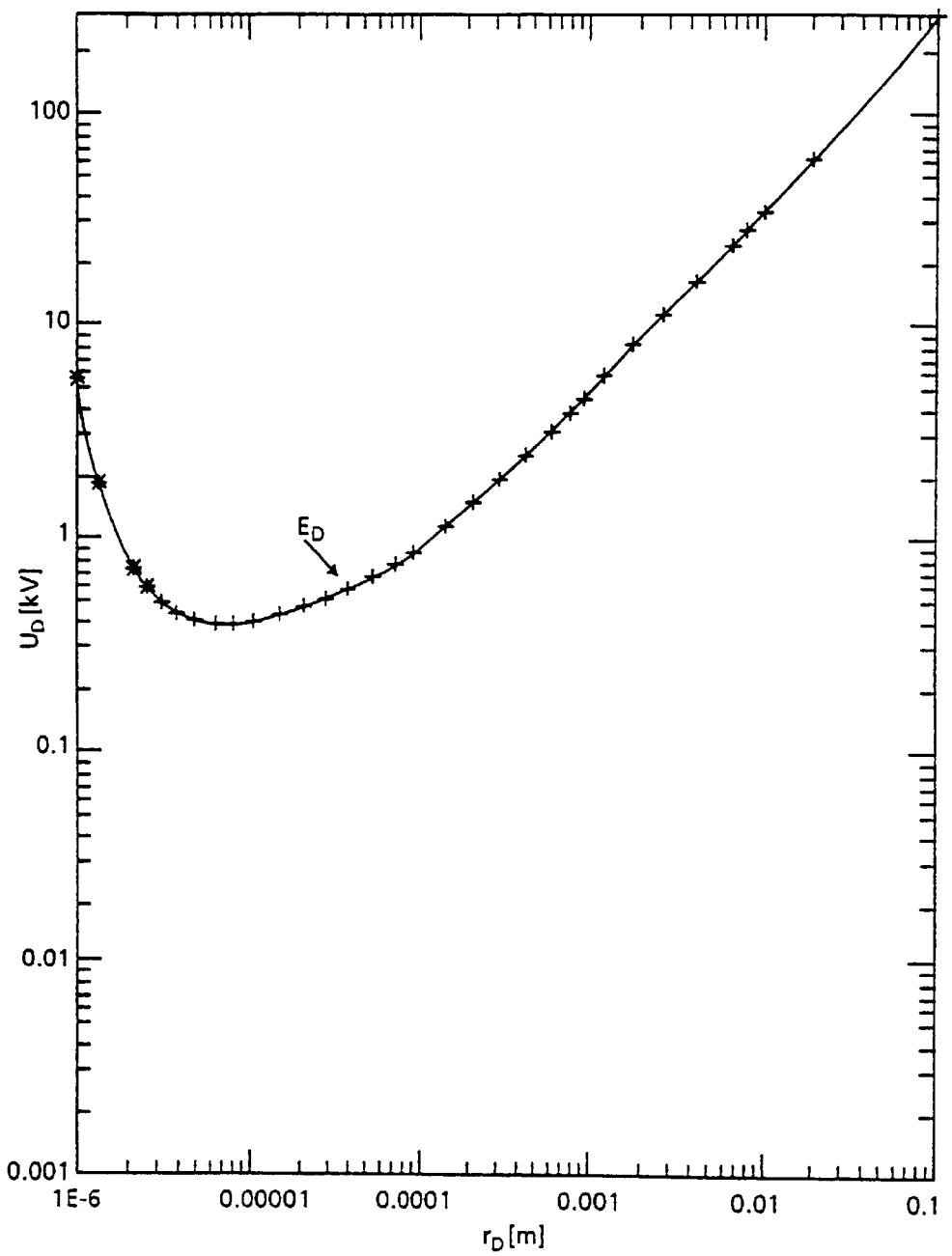
FIG. 1 shows a profile of the breakdown voltage $U_D$ (kV) as a function of the dimension $r_D$ (m) of a cavity.

DESCRIPTION OF THE DRAWINGS:

Referring now to the figures of the drawing in detail and first, particularly, to FIG. 1 thereof, there is shown the profile of the breakdown voltage $U_D$ of a cavity as a function of the diameter $r_D$ thereof given an air pressure p=10$^5$ Pa. As can be seen from the illustrated curve for the breakdown field strength $E_D$, the breakdown voltage $U_D$ increases again below dimensions of about 10 μm and is of the order of magnitude of 6 kV in the case of dimensions of about 1 μm. This breakdown voltage increase, caused by impact ionization no longer occurring below about 10 μm, is described by Paschen's law (already mentioned).

The present invention, then, advantageously exploits Paschen's law: a cavity is used as an insulating device for trench electrodes. Such a trench electrode effects charge compensation in the semiconductor body surrounding it, so that the doping can be made higher in the semiconductor body, which in turn leads to a reduction of the on resistance. It goes without saying that, if necessary, it is also possible to use a plurality of such cavities.

Figure 2:
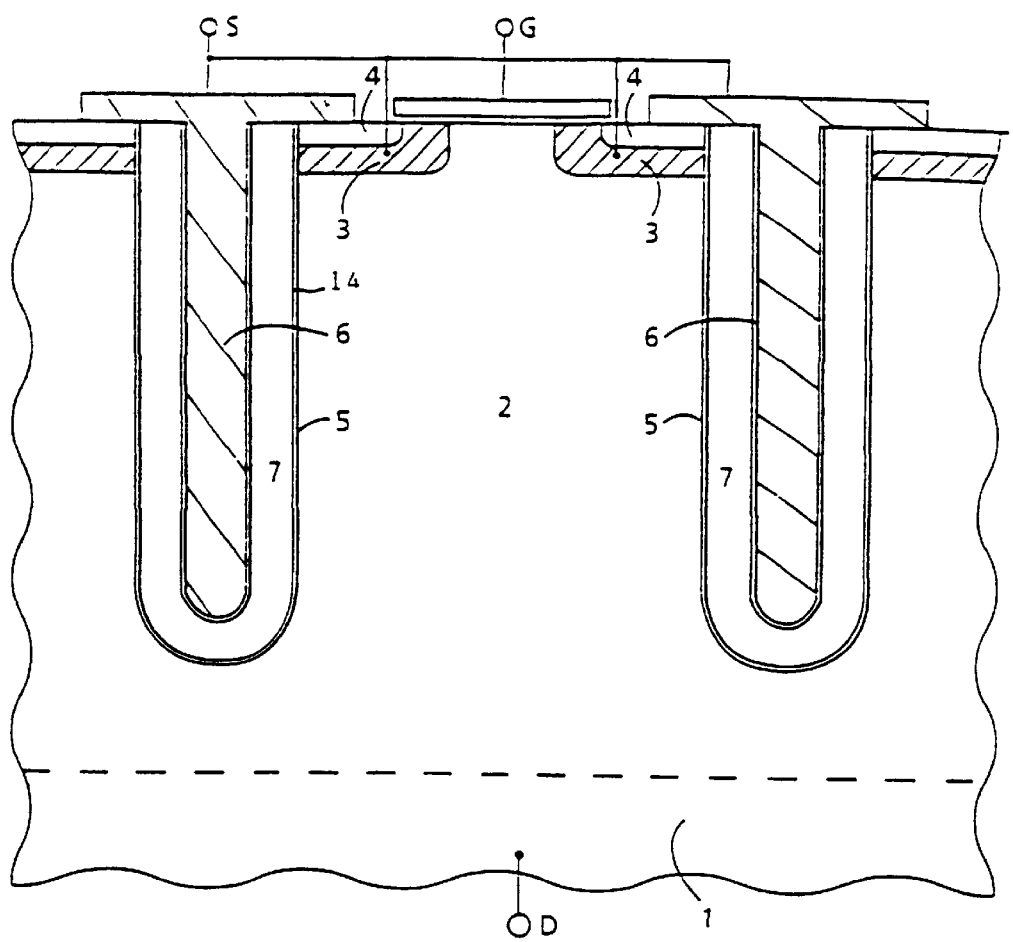
FIG. 2 shows a section through a DMOS transistor cell to illustrate a first exemplary embodiment of the invention.

FIG. 2 shows a diagrammatic section through a DMOS transistor cell as one exemplary embodiment of the invention.

Situated on an n$^+$-conducting silicon substrate 1, which is connected to a drain electrode D, there is an n$^-$-conducting epitaxial silicon layer 2, into which a p-conducting body zone 3 and an n$^+$-conducting source zone 4 are introduced. A source electrode S makes contact with the source zone 4 and the body zone 3, while a gate electrode G is provided in an insulator (not shown) above the body zone 3.

In the exemplary embodiment illustrated, a trench 5 with a trench electrode 6, which is connected to the source electrode S, is configured in the region of the body zone 3. The trench electrode 6 is surrounded by a cavity 7 as an insulating device.

In order to saturate interface states, the walls of the cavity 7 may also be completely or partly covered with a thin silicon layer 14.

The trenches 5 with the trench electrode 6 and the cavity 7 may also be configured outside the body zone 3 between individual body zones.

In this case, the trench electrodes 6 are electrically isolated from the silicon layer 2 by the pn junction between the body zone 3 and the silicon layer 2.

Figure 3:
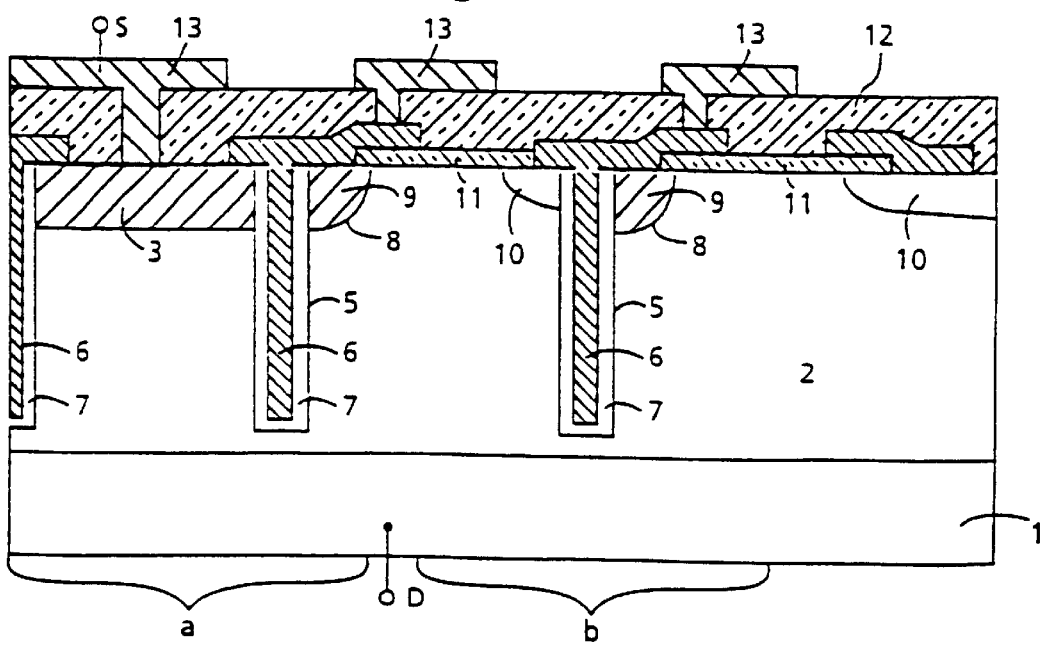
FIG. 3 shows a section through an edge termination of a cell configuration.

FIG. 3 shows an edge termination for a semiconductor configuration according to the invention. Such an edge termination can be used to realize, for example, a 600 V transistor with high doping of the epitaxial layer. A transistor cell a which is illustrated at the left-hand edge of FIG. 3 and that merely has the body zone 3 is an inactive edge cell.

Trenches 5 are introduced as the edge termination, and the trench electrodes 6 are located in the trenches in a manner insulated by a cavity 7. Since the polycrystalline silicon of the trench electrodes 6 is preferably in contact with the silicon of the epitaxial layer 2, it is necessary that, for the edge termination, a bearing area of the polycrystalline silicon is insulated by a pn junction 8. In other words, a p-conducting region 9 is disposed in the upper region of the trench 5 of the edge termination.

In order to prevent a punch-through as a result of the space charge zone abutting the "bar" of the trench electrode 6 made of polycrystalline silicon, where the "bar" is adjoining in the mesa-type region of the epitaxial silicon layer 2, the "bar" can be shielded by an n$^+$-doped region 10. The breakdown voltage of the lateral pn junction 8 thus formed and hence the voltage between two adjacent trenches 5 can be set by way of the distance between the p-conducting region 9 and the n$^+$-conducting region 10. The n$^+$-conducting region 10 can also be embedded in a p-conducting region extending over the entire mesa-type region of the n-conducting silicon layer 2.

By virtue of the series circuit including a plurality of pn diodes (cf. the pn junction 8) in the adjacent mesa-type regions, a voltage divider with a very small leakage current is realized, which provides for a defined voltage across the "bars" of the trench electrodes made of polycrystalline silicon in the trenches 5.

A multiplicity of individual termination cells b can thus be provided.

The width of the mesa-type regions of the epitaxial silicon layer 2 can increase toward the chip edge. Initially, however, the width should be similar to the width of the cells themselves.

If appropriate, it is possible to apply a defined potential between two trench electrodes 6 of the edge termination using an external voltage divider between the source S and the drain D. Such a voltage divider can be realized by high-value resistors or zener diodes. These high-value resistors or zener diodes can be realized in the polycrystalline silicon of the semiconductor configuration itself.

FIG. 3 also additionally shows a field oxide layer 11, a borophosphorus silicate glass layer 12 and aluminum metallization layers 13 for the source electrode S and the trench electrodes 6.

Figure 4:
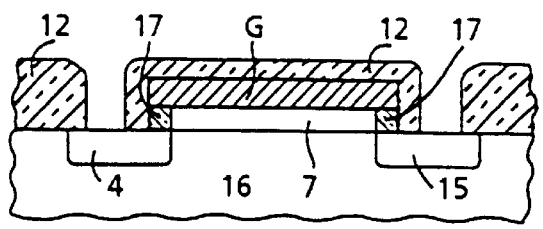
FIG. 4 shows a section through a MOS transistor to illustrate a second exemplary embodiment of the invention.

FIG. 4 shows, as a further exemplary embodiment of the invention, a MOS transistor having an n$^+$-conducting source zone 4 and an n$^+$-conducting drain zone 15, which are situated in a p-conducting semiconductor region 16. At its periphery, a gate electrode G bears on a silicon dioxide layer 17 as an insulating and holding layer and is isolated from the semiconductor region 16 by a cavity 7, which may be evacuated or filled with gas. A thin silicon dioxide layer 14 (See FIG. 2, for example) for saturating interface states may also be situated on the semiconductor region 16. In addition, a borophosphorus silicate glass layer 12 is also shown, in which the gate electrode G is embedded.

The semiconductor configuration according to the invention has been explained above with reference to a DMOS transistor cell. It goes without saying that the invention is not restricted to a DMOS transistor cell, but rather can also advantageously be applied to other semiconductor components. Examples thereof are generally gate dielectrics, metal insulation dielectrics and other insulations in MOS transistors, IGBT cells, diodes, etc.

It goes without saying that the conduction types specified in the above exemplary embodiments can also each be reversed. In this case, then, the silicon substrate 1 is p$^+$-conducting, while the body region 3 is n-conducting.

We claim:

1. A semiconductor configuration comprising:
   body regions;
   an active zone;
   a drift path;
   at least two rigid electrodes, at least one of said at least two electrodes being a trench electrode electrically connected to said active zone; and
   an insulating device electrically isolating said at least two electrodes from each another, said insulating device formed with at least one cavity, said insulating device including a structure selected from the group consisting of at least one insulating or holding layer and a pn junction;
   said trench electrode being isolated from said drift path by said cavity and surrounded by said cavity.

2. The semiconductor configuration according to claim 1, wherein said trench electrode is introduced between said body regions for reducing on resistance.

3. The semiconductor configuration according to claim 2, comprising:
   an edge termination including said trench electrode, said trench electrode having a bearing area; and
   a pn junction insulating said trench electrode and said bearing area of said trench electrode.

4. The semiconductor configuration according to claim 3, comprising:
   a highly doped region of a first conduction type shielding said trench electrode;
   said drift path being of said first conduction type.

5. The semiconductor configuration according to claim 2, comprising:
   an edge termination including said trench electrode; and
   a highly doped region of a first conduction type shielding said trench electrode;
   said drift path being of said first conduction type.

6. The semiconductor configuration according to claim 2, comprising an edge termination including an edge and a plurality of trench electrodes having distances therebetween, said distances between said plurality of said trench electrodes becoming greater toward said edge.

7. The semiconductor configuration according to claim 2, comprising a plurality of trench electrodes disposed between adjacent ones of said body regions.

8. The semiconductor configuration according to claim 2, comprising a plurality of trench electrodes routed through said body regions.

9. The semiconductor configuration according to claim 2, comprising an edge termination including a plurality of trench electrodes insulated by a cavity.

10. The semiconductor configuration according to claim 1, wherein said cavity is filled with gas.

11. The semiconductor configuration according to claim 10, wherein said gas is hydrogen.

12. The semiconductor configuration according to claim 1, wherein said cavity is evacuated.

13. The semiconductor configuration according to claim 1, wherein at least one of said at least two electrodes is made of polycrystalline silicon.

14. The semiconductor configuration according to claim 1, wherein said cavity defines walls that are at least partially covered with a thin silicon dioxide layer.

* * * * *